US008427110B2

(12) United States Patent
Oya

(10) Patent No.: US 8,427,110 B2
(45) Date of Patent: Apr. 23, 2013

(54) BATTERY SYSTEM

(75) Inventor: Takumi Oya, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 407 days.

(21) Appl. No.: 12/882,690

(22) Filed: Sep. 15, 2010

(65) Prior Publication Data

US 2011/0068719 A1 Mar. 24, 2011

(30) Foreign Application Priority Data

Sep. 18, 2009 (JP) ................................. 2009-216955

(51) Int. Cl.
*H02J 7/00* (2006.01)
(52) U.S. Cl.
USPC ........... 320/132; 320/116; 320/118; 320/122; 320/128; 320/136
(58) Field of Classification Search .................... 320/132
See application file for complete search history.

(56) References Cited

U.S. PATENT DOCUMENTS

| | | | |
|---|---|---|---|
| 6,252,376 B1 | 6/2001 | Nakamura et al. | |
| 2005/0077874 A1* | 4/2005 | Nakao ............................ | 320/116 |
| 2005/0262216 A1 | 11/2005 | Kashiwabara et al. | |
| 2008/0272736 A1 | 11/2008 | Tien et al. | |
| 2010/0033135 A1 | 2/2010 | Nishida et al. | |
| 2011/0291618 A1* | 12/2011 | Li ................................. | 320/116 |

FOREIGN PATENT DOCUMENTS

| | | |
|---|---|---|
| EP | 1580862 A1 | 9/2005 |
| JP | 09-139237 A | 5/1997 |
| JP | 11-265733 A | 9/1999 |
| JP | 2000-294298 A | 10/2000 |
| JP | 2003-168488 A | 6/2003 |
| JP | 2003-174738 A | 6/2003 |
| JP | 2008-228518 A | 9/2008 |
| JP | 2009-513095 A | 3/2009 |

OTHER PUBLICATIONS

Notice of Allowance dated Aug. 16, 2011, issued in corresponding Japanese Patent Application No. 2009-216955.
European Office Action dated Oct. 21, 2011, issued in corresponding European Patent Application No. 10176787.9.

* cited by examiner

*Primary Examiner* — Edward Tso
*Assistant Examiner* — Ahmed Omar
(74) *Attorney, Agent, or Firm* — Westerman, Hattori, Daniels & Adrian, LLP

(57) ABSTRACT

A battery system manages a plurality of battery cells of an assembled battery. The battery system includes at least a plurality of battery cell management units which is connected to the battery cells and manages the connected battery cells. The battery cell management units are connected to each other. Each of the battery cell management units comprises at least an operation mode switching unit, a parameter-related data generating unit, a parameter data transmitting unit, a parameter data receiving unit, a minimum value specifying unit, a switching command data transmitting unit, and a switching command data receiving unit.

20 Claims, 7 Drawing Sheets

US 8,427,110 B2

BATTERY SYSTEM

BACKGROUND OF THE INVENTION

1. Field of the Invention

The present invention relates to a battery system that manages a plurality of battery cells configuring an assembled battery.

Priority is claimed on Japanese Patent Application No. 2009-216955, filed Sep. 18, 2009, the content of which is incorporated herein by reference.

2. Description of Related Art

In case of monitoring and controlling for discharge and charge of a plurality of battery cells configuring an assembled battery, a plurality of CMUs (Cell monitoring Unit) are set by one per each of the battery cells or by one per some battery cells in the battery system so as to monitor the battery cells. A BMU (Battery management Unit) is electrically connected to the CMUs and manages the CMUs for monitoring a parameter (for example, a terminal voltage value and a case temperature value) of the battery cells. Thus, each of CMUs is managed by BMU (Battery Management Unit). (for example, see Japanese Laid-Open Patent Publication No. 1999-265733).

The above art described in the Japanese Patent Publication has several problems. For example, it is need for a space for setting the BMU in the battery system. Also, it becomes complicated to electrically connect each of CMUs to the BMU by electrical wiring.

SUMMARY OF THE INVENTION

In one aspect of the present invention, there is provided a battery system which manages a plurality of battery cells of an assembled battery, including at least: a plurality of battery cell management units which is connected to the battery cells and manages the connected battery cells, wherein the battery cell management units are electrically connected to each other, each of the battery cell management units includes at least: an operation mode switching unit which selectively switches an operation mode of the battery cell management unit to a slave mode in which the battery cell management unit manages the battery cell connected thereto or a master mode in which the battery cell management unit manages the battery cell connected thereto and controls other battery cell management unit; a parameter-related data generating unit which acquires a parameter of the connected battery cell and generates a parameter-related data; a parameter data transmitting unit which transmits the parameter-related data to other battery cell management unit which is operated in the master mode in case that the battery cell management unit is operated in the slave mode; a parameter data receiving unit which receives the parameter-related data acquired by other battery cell unit from other battery cell management unit which is operated in the slave mode in case that the battery cell management unit is operated in the master mode; a minimum value specifying unit which compares the parameter-related data generated by the parameter-related data generating unit with the parameter-related data received from other battery cell management unit by the parameter data receiving unit and specifies minimum parameter-related data in case that the battery cell management unit is operated in the master mode; a switching command data transmitting unit which transmits a switching command to other battery cell management unit if the parameter-related data specified by the minimum value specifying unit is received from other battery cell management unit, in case that the battery cell management unit is operated in the master mode; and a switching command data receiving unit which receives the switching command from other battery cell management unit which is operated in the master mode in case that the battery cell management unit is operated in the slave mode, wherein in the master mode, if the switching command data transmitting unit transmits the switching command to other battery cell management unit, the operation mode switching unit switches the operation mode of the battery cell management unit to which the operation mode switching unit belongs from the master mode to the slave mode, and wherein in the slave mode, if the switching command data receiving unit receives the switching command from other battery cell management unit, the operation mode switching unit switches the operation mode of the battery cell management unit to which the operation mode switching unit belongs from the slave mode to the master mode.

In another aspect of the present invention, there is provided a battery system which manages a plurality of battery cells of an assembled battery, comprising at least: a plurality of battery cells; and a plurality of battery cell management units, each of the battery cell management units being connected to each of the battery cells respectively and being electrically connected to each other, each of the battery cell management unit having an circuit for switching an operation mode of the battery cell management unit to a slave mode to be controlled by other battery cell management unit or a master mode to control other battery cell management unit on the basis of a parameter acquired from the plurality of battery cells.

As such a battery system, for example, an industrial vehicle such as a forklift, an electric vehicle, a hybrid vehicle, a moving vehicle such as an electric train, or a fixed power supply system such as a power supply system for a house can be exemplified.

BRIEF DESCRIPTION OF THE DRAWINGS

The above features and advantages of the present invention will be more apparent from the following detailed description of certain preferred embodiments taken in conjunction with the accompanying drawings, in which.

DETAILED DESCRIPTION OF THE PREFERRED EMBODIMENTS

Hereinafter, exemplary embodiments of the invention will be described, but the following embodiments do not limit a scope of the invention described in the claims. All combinations of the characteristics described in the embodiments are not indispensable for the solving means of the invention.

Figure 1:
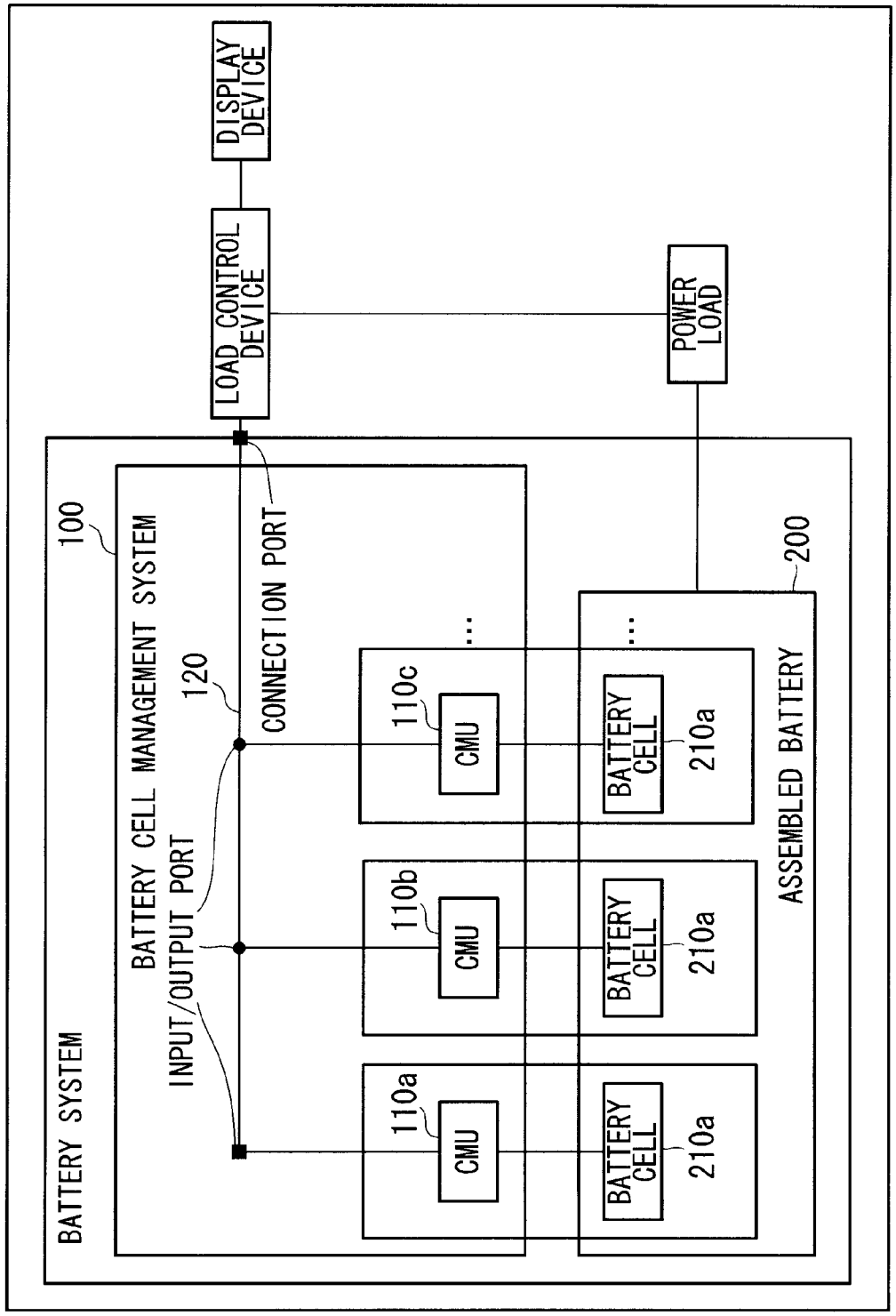
FIG. 1 is a diagram illustrating an example of the structure of a battery system including a battery cell management system 100 according to a non-limited embodiment of the invention.

FIG. 1 is a diagram illustrating an example of the structure of a battery system according to a non-limited embodiment of the invention.

A battery cell management system 100 has a structure in which a plurality of CMUs (Cell Monitoring Units) is connected with each other in parallel. Each of the CMUs is typically an electric circuit and executes a specific function described below. In this embodiment, the battery cell management system 100 comprises CMUs 110a to 110z (hereinafter, generically referred to as CMUs 110). The CMUs 110a to 110z are connected in a one-to-one correspondence with battery cells 210a to 210z (hereinafter, generically referred to as battery cells 210) in an assembled battery 200. Each of the CMUs 110 individually monitors charging and discharging of the corresponding battery cell 210. In addition, these CMUs have the specific function. That is, among the CMUs 110a to 110z, the CMU connected to the battery cell 210 with the least deterioration takes charge of the control of other CMUs each of which monitors corresponding battery cell 210. Therefore, it is possible to stably maintain a constant performance without reducing the overall process efficiency of the system. The CMUs are not always necessarily in a one-to-one correspondence with the battery cell 210, and the CMUs may be connected with each other in series.

The CMU 110 can acquire several parameters (for example, a terminal voltage value and a case temperature value) whose values vary depending on an increase or decrease in the load applied to each of the battery cells 210. The parameters are indexes for measuring the degree of deterioration of each of the battery cells 210. It is possible to determine the most stable battery cell 210 by comparing the parameters acquired from each battery cell 210.

The assembled battery 200 is connected to a power load (for example, an inverter or an electric motor) that is driven by electrical power, and the assembled battery 200 supplies the electrical power to the power load. The assembled battery 200 comprises a plurality of battery cell units 990 each of which has INPUT/OUTPUT port. One end of a communication cable (bus) 120 is connected one of the INPUT/OUTPUT ports, and the other end of the communication cable (bus) 120 is connected to a connection port (be discussed below). In addition, the assembled battery 200 is connected to, for example, a load control device through the connection port and then connected to a display device through the load control device. For example, when any parameter has an abnormal value, battery information such as the parameter may be displayed on a driver's meter panel of an electric vehicle to call the driver's attention to the battery that is likely to have a defect.

As such, the battery cell management system 100 and the assembled battery 200 are electrically connected to the load control device and the power load to form one battery system, for example, an industrial vehicle such as a forklift, an electric vehicle, a hybrid vehicle, or an electric train, or a fixed power supply system for household use.

The CMU 110 according to this embodiment has, for example, two operation modes. That is, one operation mode is a master mode in which the CMU 110 monitors and controls charging and discharging of the battery cell 210 connected to the CMU 110 and controls the operation of other CMU 110. The other operation mode is a slave mode in which the CMU 110 is controlled by another CMU 110 to monitor and control charging and discharging of the corresponding battery cell 210 connected to the CMU 110.

To be described below, the CMU 110 according to this embodiment is not constantly operated only in one operation mode, but switches its operation mode according to a condition of the assembled battery 200. The CMU 110 connected to the corresponding battery cell 210 which has the least deterioration state is operated in the master mode. Therefore, one of the plurality of CMUs 110 in the battery cell management system 100 executes an operation in the master mode and the other CMU 110 executes an operation in the slave mode.

The CMU 110 in the master mode manages other CMU 110. Therefore, in general, the battery system according to this embodiment can operate without a BMU (Battery Management Unit) that is separately incorporated in the battery management system 100 in order to manage the CMUs 110.

Figure 2:
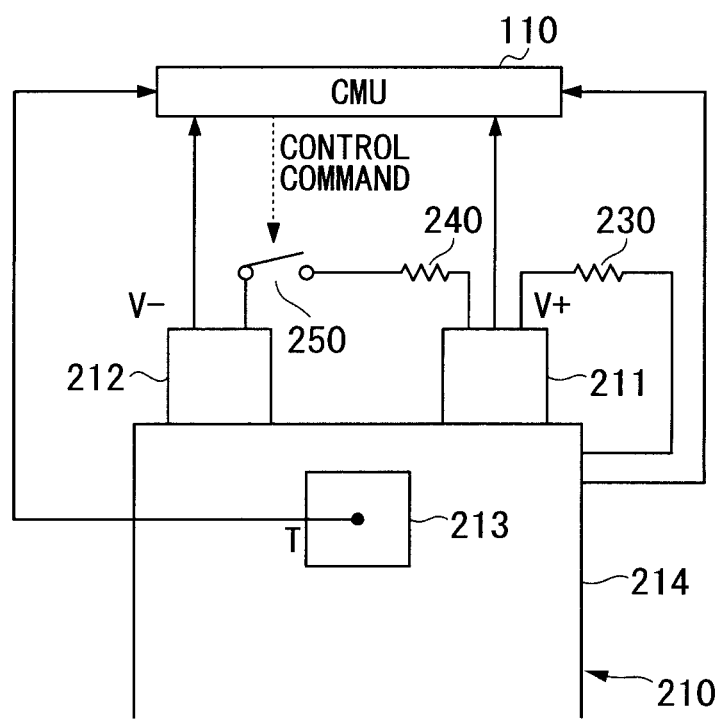
FIG. 2 is a diagram illustrating an example of the connection structure between a battery cell 210 and a CMU 110.

FIG. 2 is a diagram illustrating an example of the connection structure between the battery cell 210 and the CMU 110.

A temperature measuring circuit 213 is attached on a surface of a case body 214 of the battery cell 210. The temperature measuring circuit 213 comprises a sensor that measures the temperature of the battery cell 210. The CMU 110 acquires data indicating the temperature value of the battery cell 210 measured by the temperature measuring circuit 213. In addition, the CMU 110 detects the potential value of a positive terminal 211 with respect to a reference potential. The CMU 110 detects the voltage value between the positive terminal 211 and a negative terminal 212. In the battery cell 210, in some cases, the case body 214 and the positive terminal 211 are connected to each other with a resistor 230 interposed therebetween in order to generate a significant potential value to the case body 214. The CMU 110 may be configured so as to detect the potential value of the case body 214.

The battery system may comprise a balance circuit for a voltage balance. In case of causing a voltage variation among the battery cells 210, the balance circuit is operated to reduce the voltage value of particular battery cell 210 so as to balance each voltage value of the battery cells 210. The balance circuit comprises, for example, a switch 250 that switches the on/off of the connection between the positive terminal 211 and the negative terminal 212 with the resistor 240 interposed therebetween. The balance circuit turns on or off the switch 250 in response to a control command from the CMU 110.

A process until the balance circuit is operated will be described briefly below. Each CMU 110 in the slave mode monitors the voltage value of the corresponding battery cell 210 and transmits data indicating the voltage value and address information of the CMU 110 to the CMU 110 in the master mode through the communication cable 120 at a predetermined time interval or according to the request from the CMU 110 in the master mode.

The CMU 110 in the master mode compares the voltage values of the battery cells 210 indicated by the data received from each CMU 110. As a result of the comparison, when there is the difference between the voltage values of the battery cells 210, the CMU 110 transmits a command to operate the balance circuit to the CMU 110 that manages the battery cell 210 with a high voltage together with the address information of the CMU 110 through the communication cable 120. Since the communication cable 120 is connected in series or parallel to each CMU 110, all of the CMUs 110 in the slave mode receive the command, and only the CMU 110 corresponding to the address information executes the command. Thus, the CMU 110 corresponding to the address information transmits a control command to make the balance circuit turns on the switch 250. Then, the balance circuit receives the control command and turns on the switch 250.

Figure 3:
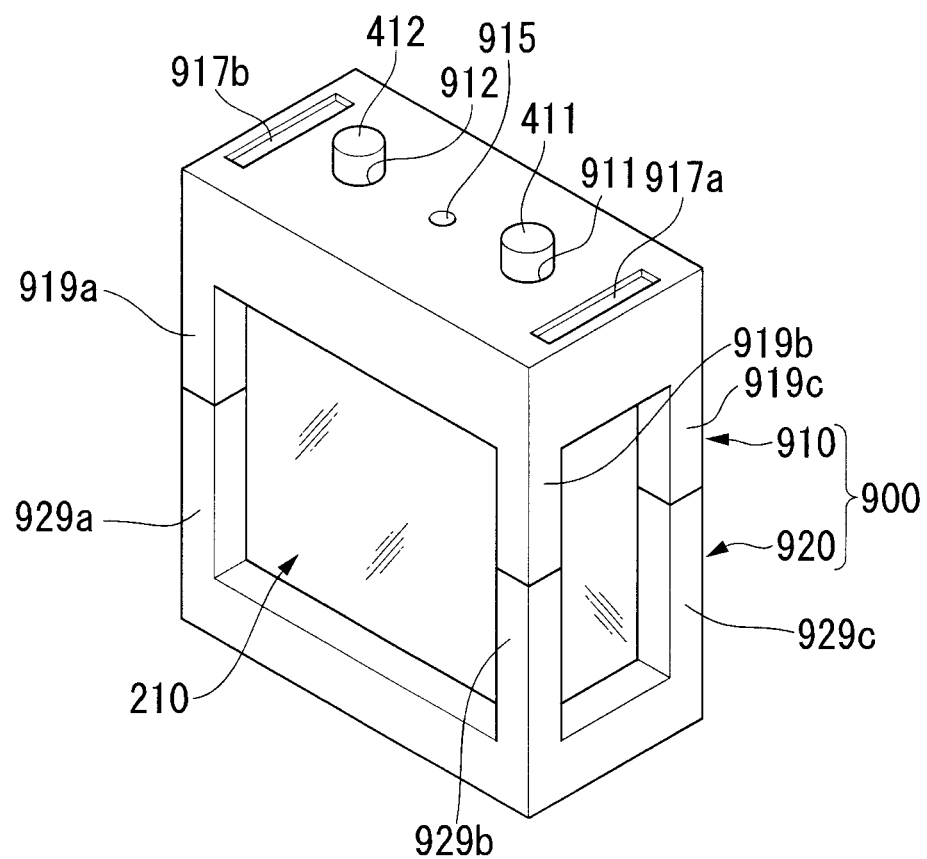
FIG. 3 is a perspective view illustrating a battery cell unit 990 including a cover unit 900 for attaching the CMU 110 to the battery cell 210.
Figure 4:
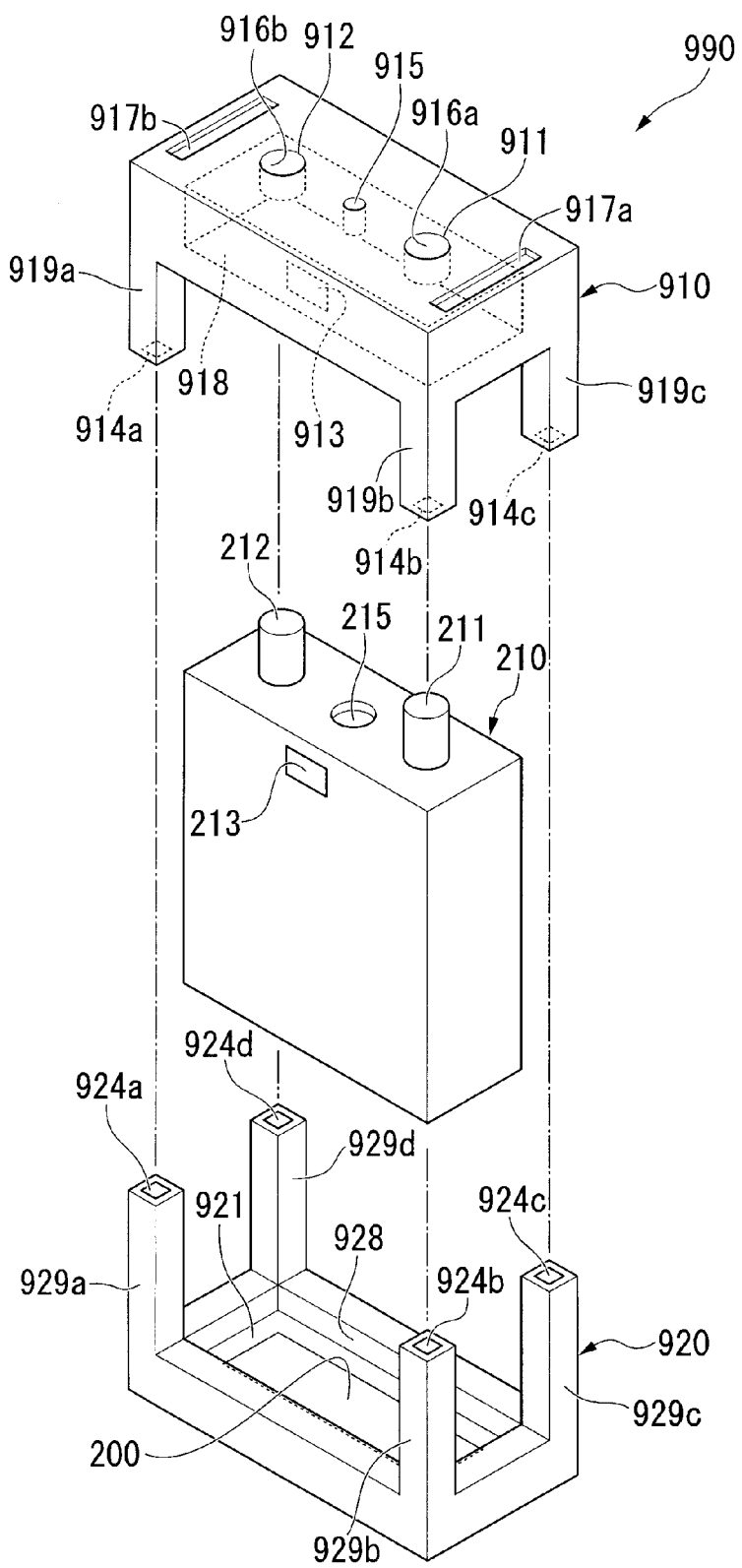
FIG. 4 is a perspective view illustrating the cover unit 900 which is disassembled in the vertical direction in the battery cell unit 990 shown in FIG. 3.

FIG. 3 is a perspective view illustrating a battery cell unit 990 including a cover unit 900 for attaching the CMU 110 to the battery cell 210. FIG. 4 is a perspective view illustrating the cover unit 900 which is disassembled in the vertical direction in the battery cell unit 990 shown in FIG. 3.

The cover unit 900 is made of an insulating material, such as plastic or rubber. If the cover unit 900 is made by using plastic or rubber, it is easy to form the cover unit 900 with a mold. Therefore, it is desirable to use such plastic or rubber for manufacturing the following structure.

In this embodiment, the battery cell unit 990 is preferably applied to a battery system under the condition that, for example, (1) the battery system comprises a plurality of battery cells 210 and a plurality of CMUs 110, (2) one battery cell 210 and one CMU 110 are electrically connected with each other in a one-to-one correspondence, and (3) the plurality of CMUs 110 are electrically connected with each other in parallel.

The battery cell unit 990 has a structure for placing the battery cell 210 and the CMU 110 in the cover unit 900. The cover unit 900 may be divided into an upper cover 910 and a lower cover 920. It is easy to operate the structure since the battery cell 210 and the CMU 110 are integrally formed so that the battery cell 210 and the CMU 110 are connected in a one-to-one correspondence with each other, that is, one battery cell and one CMU are used as one set.

The upper cover 910 comprises a concave portion 918 to which an upper part of the battery cell 210 is fitted. Supports 919a to 919d (hereinafter, generically referred to as supports 919) are formed at four corners of the upper cover 910 so as to extend downward. Holes 911 and 912 through which the positive terminal 211 and the negative terminal 212 of the battery cell 210 pass when the battery cell 210 is fitted are formed in the upper part of the upper cover 910. In this way, when the battery cell 210 is fitted to the concave portion 918 of the upper cover 910, a portion of the leading end of each of the positive terminal 211 and the negative terminal 212 of the battery cell 210 is exposed to the outside of the main body of the upper cover 910.

A hole 915 through which gas is discharged to the outside when a safety valve 215 is released is formed in the upper cover at a position where it faces the safety valve 215 of the battery cell 210 when the battery cell 210 is fitted to the concave portion 918 of the upper cover 910.

A metal terminal 913 that is electrically connected to the temperature measuring circuit 213 of the battery cell 210 when the battery cell 210 is fitted is placed on the side surface of the upper cover 910. In addition, metal contacts 916a and 916b (hereinafter, generically referred to as metal contacts 916) that are electrically connected to the positive terminal 211 and the negative terminal 212 of the battery cell 210 are placed around the holes 911 and 912 of the upper cover 910, respectively.

Input/output connectors 917a and 917b (hereinafter, generically referred to as input/output connectors 917) are formed on the upper surface of the upper cover 910. Connectors of the communication cable 120 for transmitting or receiving data are connected to the input/output connectors 917a and 917b. Connectors at the other end of the communication cable 120 are connected to the input/output connectors 917 of another cover unit 900.

An internal bus is arranged between the input/output connectors 917a and 917b of the upper cover 910 so as to directly connect the connectors in the upper cover without any device interposed therebetween. Therefore, the cover units 900 are connected to each other by the communication cable 120 and the CMUs are electrically connected each other in parallel by the communication cable 120. Since a portion of the communication cable 120 is configured in the upper cover 910, it is possible to improve flexibility in the formation of the communication cable 120. Therefore, it is possible to meet the demand for a reduction in the size of a system, such as an electric vehicle in which the battery cell management system 100 and the assembled battery 200 need to be placed in a very narrow range.

Metal terminals 914a to 914d (hereinafter, generically referred to as metal terminals 914) are placed on the leading end surfaces of the supports 919a to 919d of the upper cover 910, respectively. The leading end surfaces of the supports 919 are respectively facing to a leading end surface of a supports 929 (be discussed below). The metal terminals 914a to 914d are electrically connected to the metal terminal 913, the metal contacts 916a and 916b, or the balance circuit (not shown). In addition, the metal terminals 914a to 914d are electrically connected to one of the input/output connectors 917a and 917b or the internal bus. Since the input/output connectors 917a and 917b are connected to the communication cable 120, it is desirable to use multi-pin connectors for the input/output connectors 917a and 917b. In addition, since there are electrical connection to the metal terminals 914 and the two metal contacts (916a and 916b) and electrical connection for controlling the balance circuit, at least four or more electric paths are formed between the upper cover and the CMU 110 of the lower cover 920, which will be described below, through the four supports 919a to 919d. Therefore, some or all of the metal terminals 914 are multi-pin terminals (or multi-pin connectors) capable of transmitting a plurality of electric signals.

A concave portion 928 to which a lower part of the battery cell 210 is fitted is formed in the lower cover 920. Supports 929a to 929d (hereinafter, generically referred to as supports 929) are formed at four corners of the lower cover 920 so as to extend upward and toward the upper cover 910. The CMU 110 is buried in the bottom 921 of the lower cover 920. The reason for placing the CMU 110 in the lower cover 920 is as follows. Since the temperature of the upper part of the battery cell 210 is relatively high, it is preferable that an integrated circuit, such as the CMU, which is relatively weak against high temperatures, be placed in the lower cover 920 rather than the upper cover 910.

Metal terminals 924a to 924d (hereinafter, generically referred to as metal terminals 924) are placed on the leading end surfaces of the supports 929a to 929d of the lower cover 920, respectively. The metal terminals 924a to 924d have a shape in which they are respectively fitted to the corresponding metal terminals 914a to 914d that are electrically connected thereto. The metal terminals 924a to 924d are electrically connected to the CMU 110 inside the lower cover 920.

The battery cell unit 990 is formed by interposing the battery cell 210 between the upper cover 910 and the lower cover 920. Therefore, the CMU 110 may acquire, for example, the temperature or the inter-terminal voltage of the battery cell 210 and the potential value of the positive terminal 211 with respect to the reference potential through the metal terminals provided in the upper cover 910 and the lower cover 920.

The structure using the cover unit 900 having a square shape has been described above, but the shape of the cover unit 900 is not limited to the square shape. The cover unit 900 may have various shapes according to the shape of the battery cell 210. For example, if the battery cell 210 has a substantially cylindrical shape, the cover unit 900 may have a shape capable of accommodating the battery cell 210. That is, the cover unit 900 may have a substantially cylindrical shape in case that the upper cover 910 and the lower cover 920 are combined with each other, or it may have a square shape in case that the upper cover 910 and the lower cover 920 are combined with each other and each of the concave portion 918 of the upper cover 910 and the concave portion 928 of the lower cover 920 may have a substantially cylindrical shape according to the shape of the battery cell 210.

In this embodiment, the supports 919 of the upper cover 910 and the supports of the lower cover 920 are formed at the four corners of the upper and lower covers. However, the positions of the supports 919 and 929 are not limited thereto. That is, the supports 919 and 929 may be formed such that the leading ends of the supports 919 and the leading ends of the supports 929 come into contact with each other when the upper cover 910 and the lower cover 920 are combined, or they may be formed at positions that come into contact with the side surface of the battery cell 210. The four supports 919 and the four supports 929 are not necessarily formed, but the number of supports 919 may be equal to the number of supports 929. Since a portion of the battery cell 210 is not covered with the covers when the supports 919 and 929 of the upper cover 910 and the lower cover 920 are fitted to each other with the battery cell 210 interposed between the upper and lower covers, it is possible to effectively dissipate heat generated from the battery cell 210 through the non-covered portion.

In FIGS. 3 and 4, the battery cell unit 990 comprises one battery cell and one CMU that are integrally formed. However, the design of the battery cell unit may be appropriately changed. For example, in case that one CMU monitors a plurality of battery cells (for example, four battery cells), four upper covers 910 and four lower covers 920 may be integrally formed respectively in advance and the CMU is placed in one of the four lower covers 920.

Figure 5:
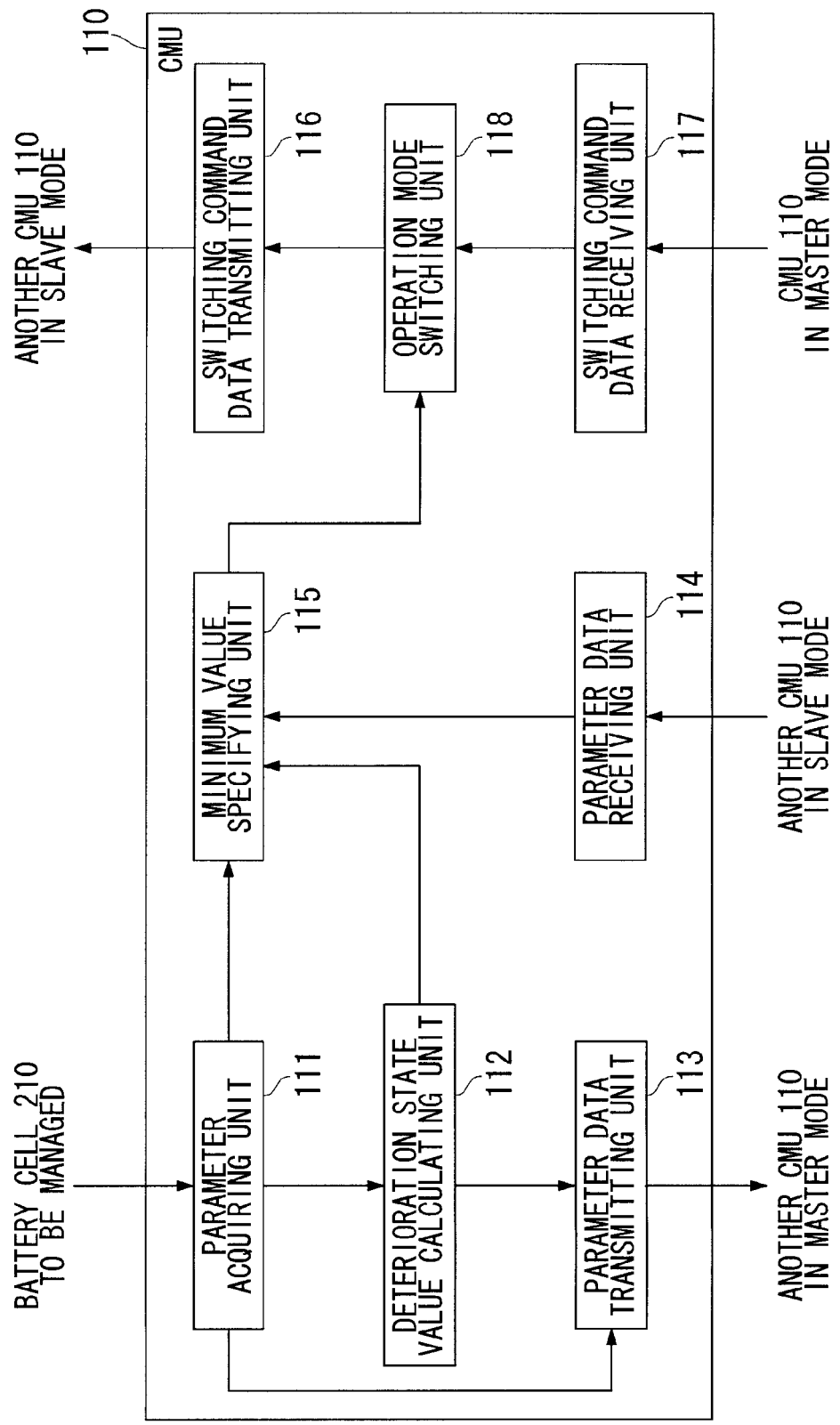
FIG. 5 is a block diagram illustrating an example of the structure of the CMU 110 according to the embodiment of the invention.

FIG. 5 is a block diagram illustrating an example of the structure of the CMU 110 according to the embodiment of the invention.

The CMU 110 comprises a parameter acquiring unit 111, a deterioration state value calculating unit 112, a parameter data transmitting unit 113, a parameter data receiving unit 114, a minimum value specifying unit 115, a switching command data transmitting unit 116, a switching command data receiving unit 117, and an operation mode switching unit 118.

Figure 6:
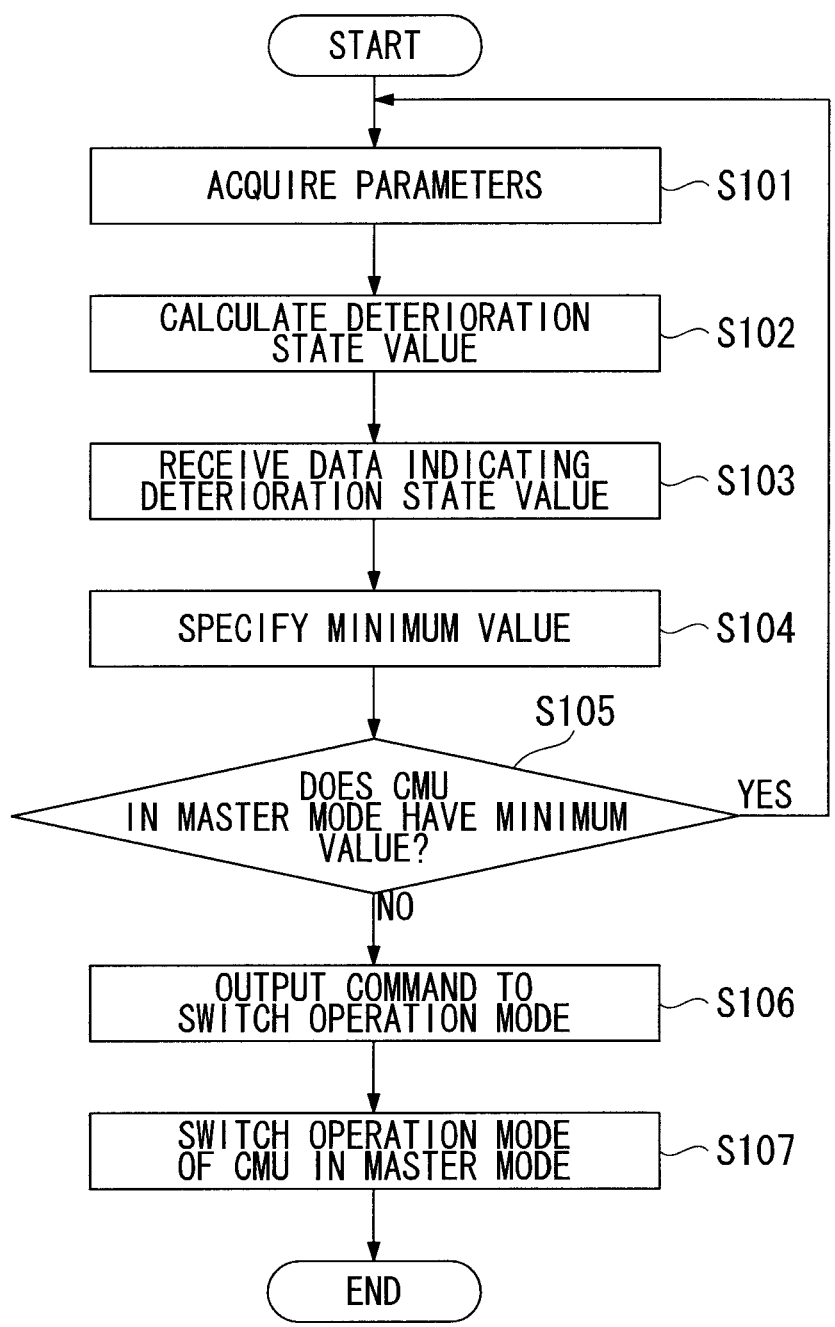
FIG. 6 is a flowchart illustrating an example of the process of the CMU 110 in the master mode.
Figure 7:
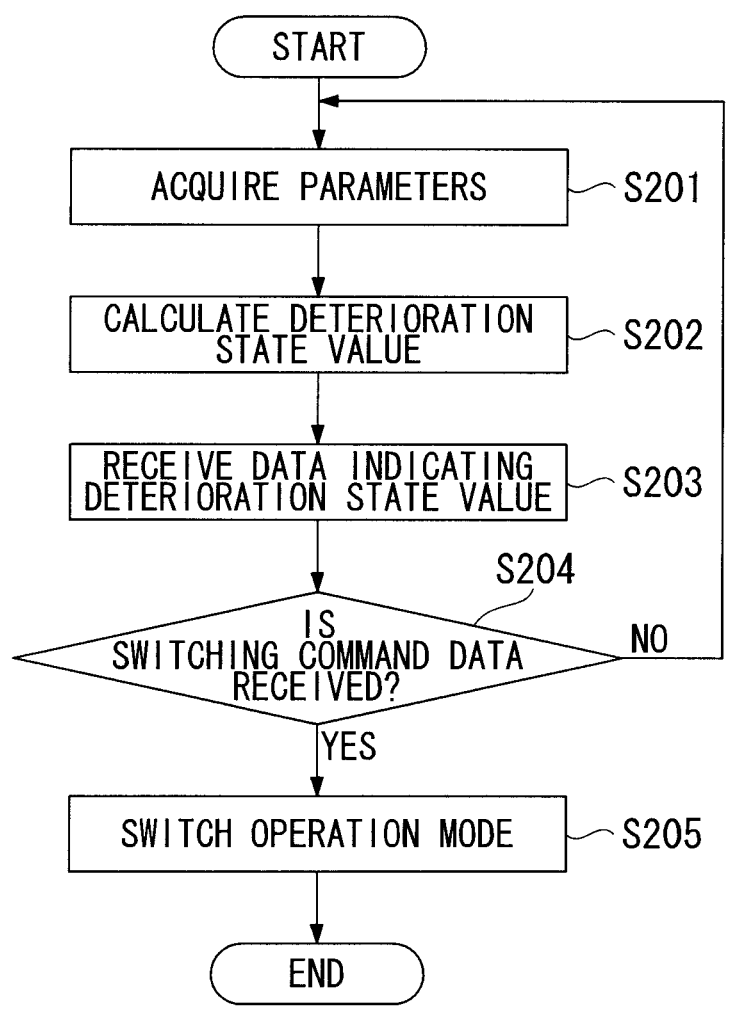
FIG. 7 is a flowchart illustrating an example of the process of the CMU 110 in the slave mode.

The operation of the structure shown in FIG. 5 will be described with reference to the flowcharts shown in FIGS. 6 and 7. FIG. 6 shows the process of the CMU 110 in the master mode, and FIG. 7 shows a process of the CMU 110 in the slave mode.

First, the operation of the CMU 110 in the master mode will be described. The CMU 110 in the master mode acquires the parameters of the battery cell 210, which is a management target connected to the CMU 110, using the parameter acquiring unit 111 (S101). The parameter acquiring unit 111 is a processing unit that acquires parameter, each of which becomes index for the deterioration state of the battery cell 210 to be managed. The parameters comprise, for example, the maximum temperature of the battery cell 210 while the battery cell 210 is operated, the number of times the balance circuit connected to the battery cell 210 started up, the inter-terminal voltage of the battery cell 210, the surrounding environment temperature of the battery cell 210, and the surrounding environment humidity of the battery cell 210. The parameter acquiring unit 111 acquires analog data of the temperature and voltage and converts these analog data into digital data. The number of times the balance circuit started up may be acquired as follows. The number of times the control command is issued to the balance circuit is stored in a counter (not shown) of the CMU 110, and the parameter acquiring unit 111 acquires the number of times the balance circuit started up in synchronization with the situation that the parameter acquiring unit 111 acquires analog data of other parameters at a predetermined time interval and converts the analog data into digital data.

The deterioration state calculating unit 112, which will be described below, may calculate a deterioration state using only one kind of parameter or plural kinds of parameters among these parameters. Since the battery cell 210 generates a complicated chemical reaction, it is preferable to use a plurality of parameters rather than one parameter in order to accurately calculate the deterioration state. Therefore, in the following description, a plurality of parameters is used to calculate a deterioration state value.

Then, the parameter acquiring unit 111 outputs the digital signal to the deterioration state calculating unit 112. The deterioration state calculating unit 112 calculates the deterioration state value indicating the deterioration state of the battery cell 210 to be managed, using digital data corresponding to each of the acquired parameters as a variable (S102). For example, a weighting coefficient is calculated for each of plural kinds of parameters and parameters multiplied by the weight coefficients are added to calculate the deterioration state value. The weighting coefficient is set for each kind of parameter in advance, and the larger weighting coefficient is set to the parameter that is more likely to be increased or decreased by the load applied to the battery cell 210.

For example, when the parameter acquiring unit 111 acquires the maximum temperature (T) during the operation of the battery cell 210 and the number of times ($N_B$) the balance circuit started up, the deterioration state value (Y) calculated by the deterioration state value calculating unit 112 is represented as follows: $Y = a \cdot T + b \cdot N_B$. In this expression, a and b are weighting coefficients.

Then, the calculated deterioration state value is output to the minimum value specifying unit 115, which will be described below.

The parameter data receiving unit 114 receives the deterioration state value and digital data indicating the address of the CMU 110 transmitted from each of the CMUs 110 in the slave mode through the communication cable 120 (S103). Then, the parameter data receiving unit 114 outputs the received digital data to the minimum value specifying unit 115.

The minimum value specifying unit 115 compares the deterioration state values received from the CMUs 110 in the master mode and the slave mode and specifies the CMU 110 that outputs the minimum deterioration state value (S104). Since the minimum value specifying unit 115 receives the address of each CMU 110 in the slave mode in addition to the deterioration state value of each CMU 110, the minimum value specifying unit 115 can easily specify the CMU 110.

The address of the CMU 110 in the master mode may be output together with the deterioration state value calculated by the deterioration state value calculating unit 112. Alternatively, the minimum value specifying unit 115 may store the address of the CMU 110 in the master mode in advance and discriminate its own deterioration state value from other data received from the CMUs 110 in the slave mode.

The minimum value specifying unit 115 outputs the address of the CMU 110 that has output the minimum deterioration state value to the operation mode switching unit 118.

The operation mode switching unit 118 compares the address information of the CMU 110 to which the operation mode switching unit 118 belongs with the address information input from the minimum value specifying unit 115. If these address information are different from each other (S105: No), operation mode switching unit 118 outputs the address information of the CMU 110 in the slave mode that acquires the minimum parameter and a switching command from the data transmitting unit 116 to the communication cable 120 such that the operation mode of the CMU 110 is switched from the slave mode to the master mode (S106). After outputting the switching command and the address information, the operation mode switching unit 118 switches the operation mode of the CMU 110 to which the operation mode switching unit 118 belongs from the master mode to the slave mode (S107).

On the other hand, if the address information of the CMU 110 to which the operation mode switching unit 118 belongs is identical to the address information input from the minimum value specifying unit 115 (S105: Yes), the operation mode switching unit 118 does not perform any switching process.

Next, the operation of the CMU 110 in the slave mode will be described.

Similar to the CMU 110 in the master mode, the parameter acquiring unit 111 acquires those parameters, which are indexes for deterioration of the battery cell 210 to be managed (S201). The digital data output by the parameter acquiring unit 111 is input to the deterioration state value calculating unit 112, and a deterioration state value is calculated (S202).

The deterioration state value calculating unit 112 outputs the calculated deterioration state value to the parameter data transmitting unit 113. The parameter data transmitting unit 113 outputs the input deterioration state value and the address information of the CMU to which the parameter data transmitting unit 113 belongs to the communication cable 120 (S203). The digital data is received by the parameter data receiving unit 114 of the CMU 110 in the master mode.

If the switching command data receiving unit 117 of the CMU 110 in the slave mode receives the switching command and the address information of the CMU 110 in the slave mode which are output from the CMU 110 in the master mode to the communication cable 120 (S204: Yes), the switching command data receiving unit 117 outputs a control signal to the operation mode switching unit 118. The operation mode switching unit 118 receiving the control signal switches the operation mode of the CMU 110 (unit to which the operation mode switching unit 118 belongs) to which the operation mode switching unit 118 belongs from the slave mode to the master mode (S205).

On the other hand, if the switching command data receiving unit 117 of the CMU 110 in the slave mode does not receive the switching command and the address information of the CMU 110 (S204: No), the CMU 110 in the slave mode repeatedly performs Steps S201 to S204.

In the above description, a plurality of parameters is used to calculate the deterioration state value, but only one parameter may be used to compare the deterioration states of the battery cells. In this case, it is not always necessary to calculate the deterioration state value, and digital data output from the parameter acquiring units 111 of the CMUs 110 may be compared with each other.

Therefore, in this case, the CMU 110 in the master mode may directly input the output of the parameter acquiring unit 111 to the minimum value specifying unit 115 without using the deterioration state value calculating unit 112. In addition, in this case, the CMU 110 in the slave mode may directly input the output of the parameter acquiring unit 111 to the parameter data transmitting unit 113 without using the deterioration state value calculating unit 112.

If it is predetermined that one parameter is used, the deterioration state value calculating unit 112 does not need to be provided in the CMU 110. Therefore, it is possible to reduce factory expense and the size of the battery system. In order to achieve a general-purpose battery system, the deterioration state value calculating unit 112 may be provided in the CMU 110 and it may be determined whether the deterioration state value calculating unit 112 is used or not according to whether the number of parameters used is one, or two or more.

In the above description, one battery cell is managed by one CMU. However, if one CMU manages a plurality of battery cells, for example, four battery cells, the parameter acquiring unit 111 may acquire the parameters of each of the four battery cells. Then, the parameter acquiring unit 111 calculates the average value of the same kind of parameters among the parameters of the four battery cells, and transmits the calculated average value to the minimum value specifying unit 115 or the deterioration state value calculating unit 112, as described above. In this way, it is possible to perform the same operation as that in which the parameters are acquired from single battery cell.

As such, if the analog data that is input as parameters to the parameter acquiring unit 111 is one kind of parameter, the analog data is converted into digital data and is then transmitted to the parameter transmitting unit 113 and the minimum value specifying unit 115. If the analog data are plural kinds of parameters, such as the maximum temperature of the battery cell while the battery cell is operated, the number of times the balance circuit started up, the inter-terminal voltage, the environmental temperature, and the environmental humidity, each of the analog data is converted into digital data and the deterioration state value calculating unit 112 uses these digital data as calculation factors to calculate the deterioration state value. Then, the deterioration state value is output to the minimum value specifying unit 115 or the parameter data transmitting unit 113. If the parameter acquiring unit 111 acquires the parameters of a plurality of battery cells 210, the parameter acquiring unit 111 outputs the average value of the same kind of parameters as analog data. Therefore, the deterioration state value calculating unit 112 or the minimum value specifying unit 115 performs the same process as the case that the parameters of single battery cell are input.

In this embodiment, the parameter acquiring unit 111 and the deterioration state value calculating unit 112 can be treated as a parameter-related data generating unit, and the digital data output from the parameter acquiring unit 111 and the deterioration state value output from the deterioration state value calculating unit 112 can be treated as parameter-related data output from the parameter-related data generating unit since they are both digital data related to the parameters.

As such, in the battery cell management system 100 according to this embodiment, if there is a special CMU 110 monitoring the battery cell 210 which is less deteriorated than the battery cell 210 monitored by the CMU 110 in the master mode, the CMU 110 in the master mode controls a monitoring control mode such that the special CMU 110 newly becomes a CMU 110 in the master mode. Therefore, according to this embodiment, the BMU that is generally provided in the battery cell management system 100 is not required.

For example, if the battery temperature is too high, the CMU 110 monitoring the battery cell 210 with a large deterioration state value transmits an error signal to the load control device to notify the user that the battery temperature is too high. Therefore, the processing load of a processing device, such as a processor, of the CMU 110 is relatively larger than that of the processor of the CMU 110 that monitors the battery cell with a small deterioration state value. If the processing load becomes large, then, for example, a processing error may occur or the processing speed of the processor becomes slow. However, in the battery cell management system 100 according to this embodiment, the CMU in the master mode is timely switched to the CMU with the least processing load among a plurality of CMUs. Therefore, for example, the reduction in the processing speed is less likely to occur.

That is, the battery cell management system 100 according to this embodiment can construct a master-slave system that does not comprise the BMU and does not apply an excessive processing load to any of the CMUs 110.

According to exemplary embodiments of the invention, the battery cell management unit that monitors the most stable battery cell, that is, the CMU of the battery cell with the least deterioration manages the control operation of other CMUs.

Therefore, it is possible to stably manage all battery cells using only a plurality of battery cell management units that is directly connected to a plurality of battery cells, for example, a plurality of CMUs, without reducing process efficiency.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description.

What is claimed is:

1. A battery system which manages a plurality of battery cells of an assembled battery, comprising:
    a plurality of battery cell management units which is connected to the battery cells and manages connected battery cells,
    wherein the battery cell management units are electrically connected to each other,
    each of the battery cell management units comprises:
    an operation mode switching unit which selectively switches an operation mode of the battery cell management unit to a slave mode in which the battery cell management unit manages the battery cell connected thereto or a master mode in which the battery cell management unit manages the battery cell connected thereto and controls other battery cell management unit;
    a parameter-related data generating unit which acquires a parameter of the connected battery cell and generates a parameter-related data;
    a parameter data transmitting unit which transmits the parameter-related data to other battery cell management unit which is operated in the master mode in case that the battery cell management unit is operated in the slave mode;
    a parameter data receiving unit which receives the parameter-related data acquired by other battery cell unit from other battery cell management unit which is operated in the slave mode in case that the battery cell management unit is operated in the master mode;
    a minimum value specifying unit which compares the parameter-related data generated by the parameter-related data generating unit with the parameter-related data received from other battery cell management unit by the parameter data receiving unit and specifies minimum parameter-related data in case that the battery cell management unit is operated in the master mode;
    a switching command data transmitting unit which transmits a switching command to other battery cell management unit if the parameter-related data specified by the minimum value specifying unit is received from other battery cell management unit, in case that the battery cell management unit is operated in the master mode; and
    a switching command data receiving unit which receives the switching command from other battery cell management unit which is operated in the master mode in case that the battery cell management unit is operated in the slave mode,
    wherein in the master mode, if the switching command data transmitting unit transmits the switching command to other battery cell management unit, the operation mode switching unit switches the operation mode of the battery cell management unit to which the operation mode switching unit belongs from the master mode to the slave mode, and
    wherein in the slave mode, if the switching command data receiving unit receives the switching command from other battery cell management unit, the operation mode switching unit switches the operation mode of the battery cell management unit to which the operation mode switching unit belongs from the slave mode to the master mode.

2. The battery system according to claim 1,
    wherein the parameter-related data generating unit acquires at least one of the maximum temperature of the connected battery cell while the battery cell is operated, the number of times a balance circuit started up, an inter-terminal voltage, an environmental temperature, and an environmental humidity as the parameters.

3. The battery system according to claim 2, further comprising a deterioration state value calculating unit,
    wherein the parameter-related data generating unit acquires plural kinds of the parameters, and
    the deterioration state value calculating unit calculates a deterioration state value of the connected battery cell using the plural kinds of the parameters and outputs the deterioration state value as the parameter-related data.

4. The battery system according to claim 3, further comprising:
    a power load which is operated by electrical power supplied from the assembled battery;
    a connection port;
    a load control device which is connected to the battery cell management unit through the connection port and controls the power load according to the parameters; and
    a display device which displays battery information output from the load control device.

5. The battery system according to claim 4,
    wherein the power load is an electric motor, and the battery system is any one of an industrial vehicle, an electric vehicle, a hybrid vehicle, and an electric train which can be moved by the electric motor.

6. The battery system according to claim 1, further comprising a plurality of pairs of upper covers and lower covers made of an insulator,
    wherein the upper cover comprises input-output connectors,
    the battery cell management unit is arranged in the lower cover,
    the upper cover is provided in an upper part of the battery cell in which positive and negative terminals are formed,
    the lower cover is fitted to the upper cover with the battery cell interposed therebetween such that the battery cell, the upper cover, and the lower cover are integrally formed,
    the input-output connectors and the battery cell management unit are electrically connected to each other, and the plurality of battery cell management units are connected to each other through the input-output connectors.

7. A battery system, comprising:
a plurality of battery cells; and
a plurality of battery cell management units, each of the battery cell management units being connected to each of the battery cells respectively and being connected electrically to each other, each of the battery cell management unit having an circuit for switching an operation mode of the battery cell management unit to a slave mode to be controlled by other battery cell management unit or a master mode to control other battery cell management unit on the basis of a parameter acquired from the plurality of battery cells.

8. A battery system according to the claim 7, further comprising:
a load control device which is electrically connected to the battery cell management unit and controls a power load according to the parameter; and
a display device which displays battery information output from the load control device.

9. A battery system according to the claim 7, further comprising:
a cover unit, each of the battery cell and each of the battery cell management unit being placed in the cover unit, the cover unit comprising an upper cover and a lower cover.

10. A battery system according to the claim 9,
wherein the battery cell management unit is placed in the lower cover of the cover unit.

11. A battery system according to the claim 10, further comprising:
an internal bus which is arranged in the upper cover;
an INPUT/OUTPUT connector which is electrically connected to the internal bus and the battery cell management unit.

12. A battery system according to the claim 11,
wherein the upper cover and the lower cover have supports respectively, and wherein an end surfaces of the upper cover and corresponding end surfaces of the lower cover are facing to each other.

13. A battery system according to the claim 12, further comprising:
a metal terminal which is placed on the leading end surface of the upper cover and lower cover and electrically connects to each other.

14. A battery system according to the claim 13,
Wherein the plurality of the battery cell management units are connected in a one-to-one correspondence with the plurality of the battery cells, and wherein each of the battery cell and battery cell management unit are arranged in the cover unit respectively.

15. A battery system according to the claim 7,
the circuit comprising:
an operation mode switching unit which selectively switches the operation mode of the battery cell management unit;
a parameter-related data generating unit which acquires the parameter of the connected battery cell and generates parameter-related data on the basis of the parameter;
a parameter data transmitting unit which transmits the parameter-related data to other battery cell management unit which is operated in the master mode in case that the battery cell management unit is operated in the slave mode;
a parameter data receiving unit which receives the parameter-related data acquired by other battery cell from other battery cell management unit which is operated in the slave mode in case that the battery cell management unit is operated in the master mode;
a minimum value specifying unit which acquires the parameter-related data from the parameter data receiving unit, the minimum value specifying unit comparing the parameter-related data and specifying minimum parameter-related data in case that the battery cell management unit is operated in the master mode;
a switching command data transmitting unit which transmits a switching command to other battery cell management unit of which the parameter-related data generating unit generates the minimum parameter-related data in case that the battery cell management unit is operated in the master mode, the switching command being a command to switch the operation mode from the slave mode to the master mode; and
a switching command data receiving unit which receives the switching command in case that the battery cell management unit is operated in the slave mode.

16. A battery system according to the claim 15,
wherein in the master mode, if the switching command data transmitting unit transmits the switching command to other battery cell management unit, and the operation mode switching unit switches the operation mode of the battery cell management unit to which the operation mode switching unit belongs from the master mode to the slave mode, and
wherein in the slave mode, if the switching command data receiving unit receives the switching command from other battery cell management unit, the operation mode switching unit switches the operation mode of the battery cell management unit to which the operation mode switching unit belongs from the slave mode to the master mode.

17. A battery system according to the claim 15,
wherein the parameter-related data generating unit acquires plural kinds of the parameters.

18. A battery system according to the claim 17,
the circuit further comprising:
a deterioration state value calculating unit which calculates a deterioration state of corresponding battery cell on the basis of the parameter-related data,
wherein the minimum value specifying unit specifies a minimum deterioration state and wherein the switching command data transmitting unit transmits the switching command to other battery cell management unit of which the corresponding battery cell has a least deterioration state value.

19. A battery system according to the claim 18,
wherein weighting coefficient is set for each kind of parameter, and wherein the deterioration state value calculating unit calculates the deterioration state on the basis of the weighting coefficient.

20. A battery system according to the claim 19,
wherein a larger weighting coefficient is set to the parameter that is more likely to be increased or decreased by a load applied to the battery cell.

* * * * *